United States Patent [19]

Fackenthal et al.

[11] Patent Number: 5,563,843
[45] Date of Patent: Oct. 8, 1996

[54] METHOD AND CIRCUITRY FOR PREVENTING PROPAGATION OF UNDESIRED ATD PULSES IN A FLASH MEMORY DEVICE

[75] Inventors: Richard E. Fackenthal; Duane R. Mills, both of Folsom, Calif.

[73] Assignee: Intel Corporation, Santa Clara, Calif.

[21] Appl. No.: 401,474

[22] Filed: Mar. 9, 1995

[51] Int. Cl.$^6$ .......................................... G11C 8/00
[52] U.S. Cl. .................. 365/233.5; 365/233; 365/185.33; 365/189.05
[58] Field of Search ................................ 365/233.5, 900, 365/233, 189.05, 207, 185.33; 326/104, 93

[56] References Cited

U.S. PATENT DOCUMENTS

| | | | |
|---|---|---|---|
| 5,222,046 | 6/1993 | Kreifels et al. | 365/900 X |
| 5,243,575 | 9/1993 | Sambandan et al. | 365/900 X |
| 5,265,064 | 11/1993 | Davies et al. | 365/233.5 |
| 5,313,435 | 5/1994 | Kim et al. | 365/233.5 |
| 5,414,672 | 5/1995 | Ozeki et al. | 365/233.5 |
| 5,418,479 | 5/1995 | Sambandan | 365/233.5 X |

*Primary Examiner*—David C. Nelms
*Assistant Examiner*—Huan Hoang
*Attorney, Agent, or Firm*—Blakely, Sokoloff, Taylor & Zafman

[57] ABSTRACT

An Address Transition Detection (ATD) circuit for use in memory devices. The ATD circuit includes a pulse generator for generating an ATD pulse. For asynchronous memory device, the pulse generator generates the ATD pulse in response to an address transition, wherein for synchronous devices, the pulse generator generates the ATD pulse in response to control signals that indicate a valid address. The ATD circuit also includes a control circuit and a mask circuit. The control circuit is operative to asserting a first control signal in response to receiving the pulse. The mask circuit is coupled between the output of the pulse generator and the control circuit for preventing propagation of the ATD pulse if the first control signal is active.

12 Claims, 5 Drawing Sheets

METHOD AND CIRCUITRY FOR PREVENTING PROPAGATION OF UNDESIRED ATD PULSES IN A FLASH MEMORY DEVICE

FIELD OF THE INVENTION

The present invention relates generally to memory devices and more particularly to address transition detection circuitry of memory devices.

BACKGROUND OF THE INVENTION

Static Random Access Memory devices ("SRAMs"), Electrically Programmable Read Only Memory devices ("EPROMs"), and flash Electrically Erasable Programmable Read Only Memory devices ("flash EEPROMs") often include Address Transition Detection (ATD) circuitry that increases the speed of read operations for the memory devices. In response to detecting a transition in the value of the address lines of the memory device, the ATD circuitry typically resets the sense amplifiers and latches the data output corresponding to the previous address.

Resetting the sense amplifiers causes the sense amplifiers to be cleared or otherwise set up to sense the newly addressed portions of the memory device. For differential sense amplifiers, resetting typically entails the equalization of sense amplifiers. For single-ended sense amplifiers, resetting typically entails precharging the bitlines of the memory device. The previously sensed data is latched to prevent the output of invalid data that may occur because of the sense amplifiers fluctuating during the resetting process. Resetting the sense amplifiers and latching the previous data are operations that are typically required for every memory read operation.

There are some instances wherein it is undesirable to reset the sense amplifiers and latch the output in response to an address transition. For example, for typical prior asynchronous memory devices, if a user changes the address before the data of the immediately previous read operation are output, the ATD circuitry resets the sense amplifiers, and the data of the immediately prior read operation are never output. The outputs of the memory device remain at the value of the last validly sensed quantity of data.

Another example is when a synchronous memory device that can output some maximum number of bits is configured to output less than the maximum number of bits. For example, a memory device capable of outputting a word (sixteen bits) of data at a time may be configured to sequentially output each byte (eight bits) of the data word. Wherein the user has typically requested only a single byte of data, the memory device typically senses both bytes of the data word simultaneously, and the least significant bit of the address is used to control a multiplexer that selects the desired byte of the data word. If the sense amplifiers were reset in response to a transition of the least significant bit of the address, the sensing of the second byte of data would need to be repeated, slowing the speed of operation for the memory device. Asynchronous devices typically solve this problem by ignoring the least significant bit of the address for purposes of address transition detection.

For synchronous memory devices, the ATD circuitry may be activated in response to control signals that indicate a valid address, rather than in response to detecting an address transition. The memory device ignores the values on the address lines when the control signals indicate that the address is not valid. When sequentially reading out the bytes of a data word, the address of the second byte of data must be passed to the memory device so that the multiplexer may be appropriately configured to output the second byte of data. Therefore, the second address of the data word is indicated as a valid address, which activates the ATD circuitry to reset the sense amplifiers even though the desired data is already contained in the sense amplifiers. A mechanism should be provided to prevent the ATD circuitry from resetting the sense amplifiers and latching the output in such an instance.

SUMMARY AND OBJECTS OF THE INVENTION

Therefore, it is an object of the invention to provide ATD circuitry that prevents the propagation of undesired ATD pulses.

This and other objects of the invention are provided by a circuit that masks undesired ATD pulses. The circuit generally comprises a pulse generator, a mask circuit, and a control circuit. The pulse generator outputs an ATD pulse in response to appropriate control signal conditions. A mask circuit is coupled in series between the pulse generator and the control circuit for masking undesired ATD pulses as determined by the state of the control circuit's output. The control circuit asserts a first control signal in response to receiving a valid first ATD pulse. The first control signal is fed back to the mask circuit. If a second ATD pulse is received by the mask circuit when the first control signal is active, the mask circuit prevents propagation of the second ATD pulse to the control circuit.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

ATD circuitry having a mask circuit for preventing the propagation of an undesired ATD pulse is described herein. For asynchronous memory devices, an undesired ATD pulse may occur in response to a user providing a new address when a previous read operation is currently being performed. Typically, receiving the new address results in the current read operation not being completely performed. For synchronous memory devices, undesirable ATD pulses may occur due to the nature in which ATD pulses are generated. The ATD circuitry described herein may find use in both synchronous and asynchronous memory devices.

Figure 1:
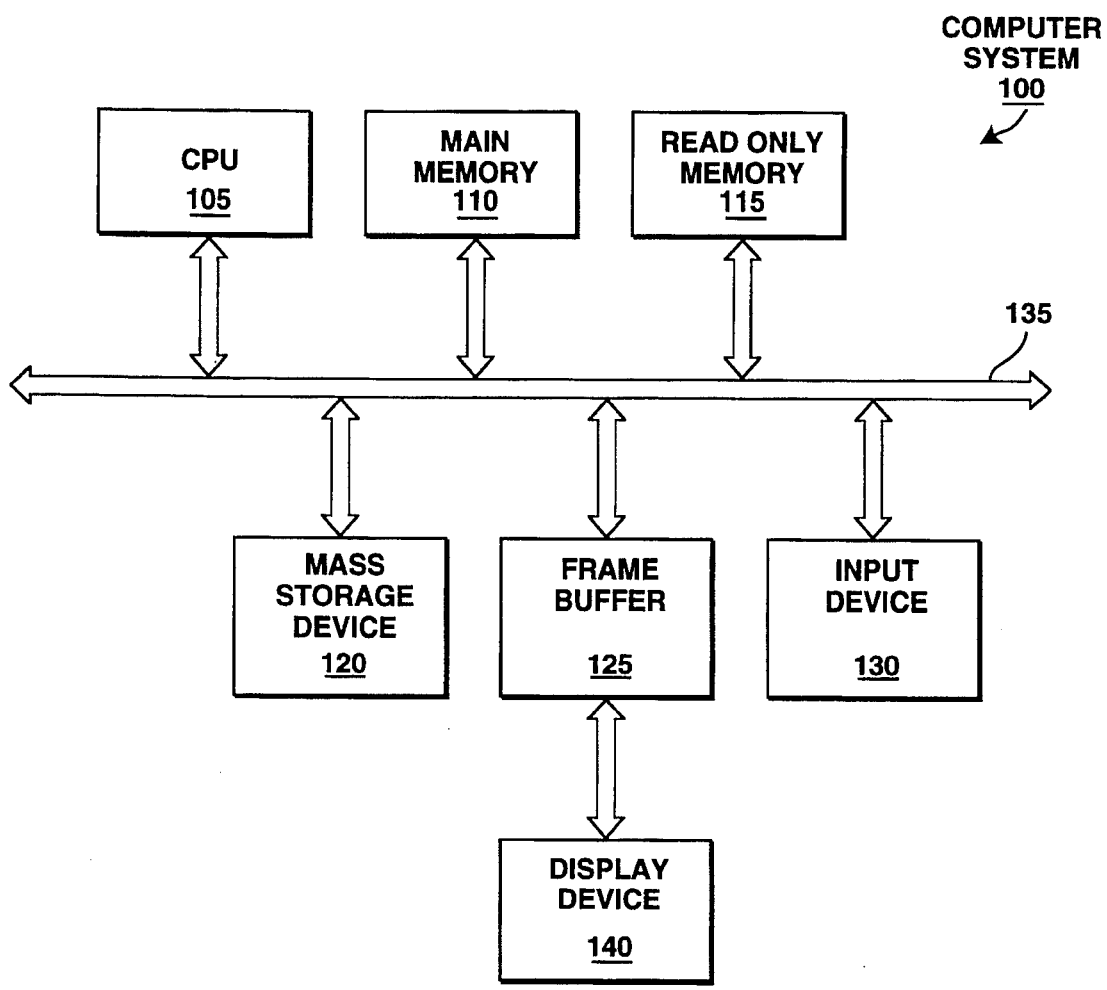
FIG. 1 shows a general purpose computer system that includes memory devices having ATD circuitry according to the present invention.

FIG. 1 shows a general purpose computer system 100 that includes a central processing unit ("CPU") 105, a main memory 110, a read only memory 115, a mass storage device 120, a frame buffer 125, and an input device 130, all of which are coupled to a bus 135. The bus 135 includes a data bus and acts as a primary interconnect for the components of the computer system 100 so that data may be transferred among the various components. The computer system 100 also includes a display device 140 that is coupled to the frame buffer 125 for receiving image data for display. The read only memory 115 may be a flash EEPROM, and the mass storage device 120 may be a "solid state disk drive" that includes a plurality of flash EEPROMs for emulating the operation of a magnetic hard disk drive. The computer system 100 may be a portable computer, a workstation, a minicomputer, a programmable digital assistant ("PDA"), a mainframe, or any other type of computer.

Figure 2:
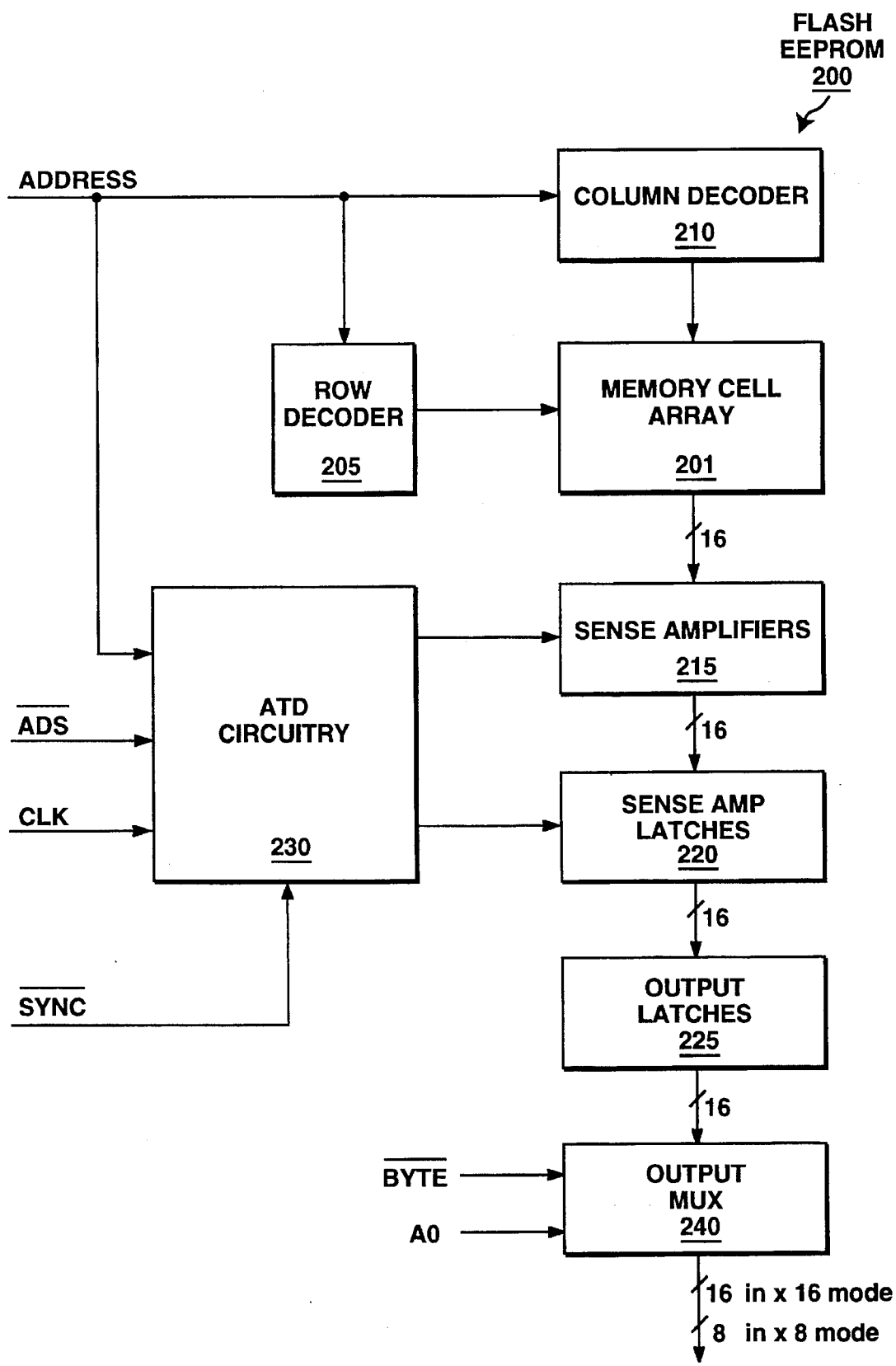
FIG. 2 shows a Flash EEPROM that includes ATD circuitry for locking out an ATD pulse in response to certain predefined conditions.

FIG. 2 shows a flash EEPROM that includes ATD circuitry that locks out an undesired ATD pulse in response to certain predefined conditions. The flash EEPROM 200 is an integrated circuit that may be formed on a single semiconductor substrate and that typically includes a memory cell array 201, a row decoder 205, a column decoder 210, sense amplifiers 215, sense amplifier latches 220, output latches 225, ATD circuitry 230, and output multiplexer 240. The memory cell array 201 generally comprises a plurality of flash memory cells (not shown), each of which is a floating gate transistor device having a select gate, a floating gate, a drain, and a source. The flash memory cells of the memory cell array 201 are arranged in a matrix of rows and columns, wherein a common "wordline" is coupled to the select gate of each flash memory cell of a row and a common "bitline" is coupled to the drain of each flash memory cell of a column.

To read data stored in the memory cell array 201, a user provides an address via the address signal lines. The row decoder 205 decodes a portion of the address to select the desired wordline of the memory cell array 201 and applies a wordline voltage to the select gates of all the memory cells coupled to the selected wordline. The column decoder 210 similarly decodes a portion of the address to select the desired bitlines of the memory cell array 201. Those memory cells that are connected to the selected wordline and to a selected bitline are selected for reading. For flash EEPROM 200, sixteen memory cells may be read in parallel, and flash EEPROM 200 may thus output a data word for every read operation.

The sense amplifiers 215 are coupled to the selected bitlines for sensing the state of selected memory cells, and each sense amplifier 215 outputs a digital logic value that indicates the analog state of the associated memory cell. When the user provides an address, the sense amplifiers 215 are equalized by the ATD circuitry 230 such that the time to perform a read operation may be decreased. The output of the sense amplifiers vary during the equalization period, and the sense amp latches 220 are provided to latch the data word previously output by the sense amplifiers 215, preventing the propagation of invalid data to the outputs of the flash EEPROM during the equalization process. Output latches 225 are similarly provided between the sense amp latches 220 and the outputs of the flash EEPROM 200 to latch the value output by the sense amp latches 220.

As shown, the data path from the memory cell array 201 to the output multiplexer 240 is sixteen bits wide. The flash EEPROM 200 is capable of outputting data according to two different modes. For the "by-sixteen" ("×16") mode, the flash EEPROM 200 outputs sixteen bits of data at a time. For the "by-eight" ("×8") the flash EEPROM outputs eight bits of data at time. A $\overline{\text{BYTE}}$ control signal coupled to the output multiplexer 240 is provided to select between the ×8 and ×16 modes. Regardless of the selected output mode, sixteen bits of data are always sensed by the sense amplifiers 215. When the $\overline{\text{BYTE}}$ control signal is asserted active low, A0, which is the least significant bit of the address, is used by the output multiplexer 240 to determine which byte of the sensed data word is to be output. Thus, the $\overline{\text{BYTE}}$ control signal and A0 are shown as being coupled to the output multiplexer 240 for selecting the desired byte of a data word to output while operating in the ×8 mode.

A $\overline{\text{SYNC}}$ control signal may be provided to select whether read accesses of the flash EEPROM 200 are to be performed in an asynchronous or synchronous manner. When the $\overline{\text{SYNC}}$ control signal is in an inactive high logic state, read accesses are performed asynchronously, and the ATD circuitry 230 generates an ATD pulse in response to a transition in the value carried by the address lines. For flash EEPROM 200, transitions of the least significant bit A0 are ignored by the ATD circuitry. Assuming that the flash EEPROM 200 is enabled to perform read accesses, the row decoder 205 and the column decoders 210 decode the address provided by the address lines whenever the value of the address lines changes.

When the $\overline{\text{SYNC}}$ control signal is in an active low logic state, read accesses are performed synchronously. The ATD circuitry 230 generates an ATD pulse in response to a CLK clock signal and an $\overline{\text{ADS}}$ address strobe signal, and the ATD circuitry 230 ignores transitions in the value of the address lines. The initiation of a new read access is signaled by the $\overline{\text{ADS}}$ signal being active low when the CLK signal transitions from a logic low state to a logic high state, at which time the row and column decoders decode the address, and the ATD circuitry 230 generates an ATD pulse.

Flash EEPROM 200 need not be able to operate both synchronously and asynchronously, and the $\overline{\text{SYNC}}$ signal need not be provided. For synchronous operation, it is sufficient to provide the $\overline{\text{ADS}}$ and CLK for detecting address transactions. For asynchronous operation, the $\overline{\text{ADS}}$ and CLK signals are not required.

Figure 3:
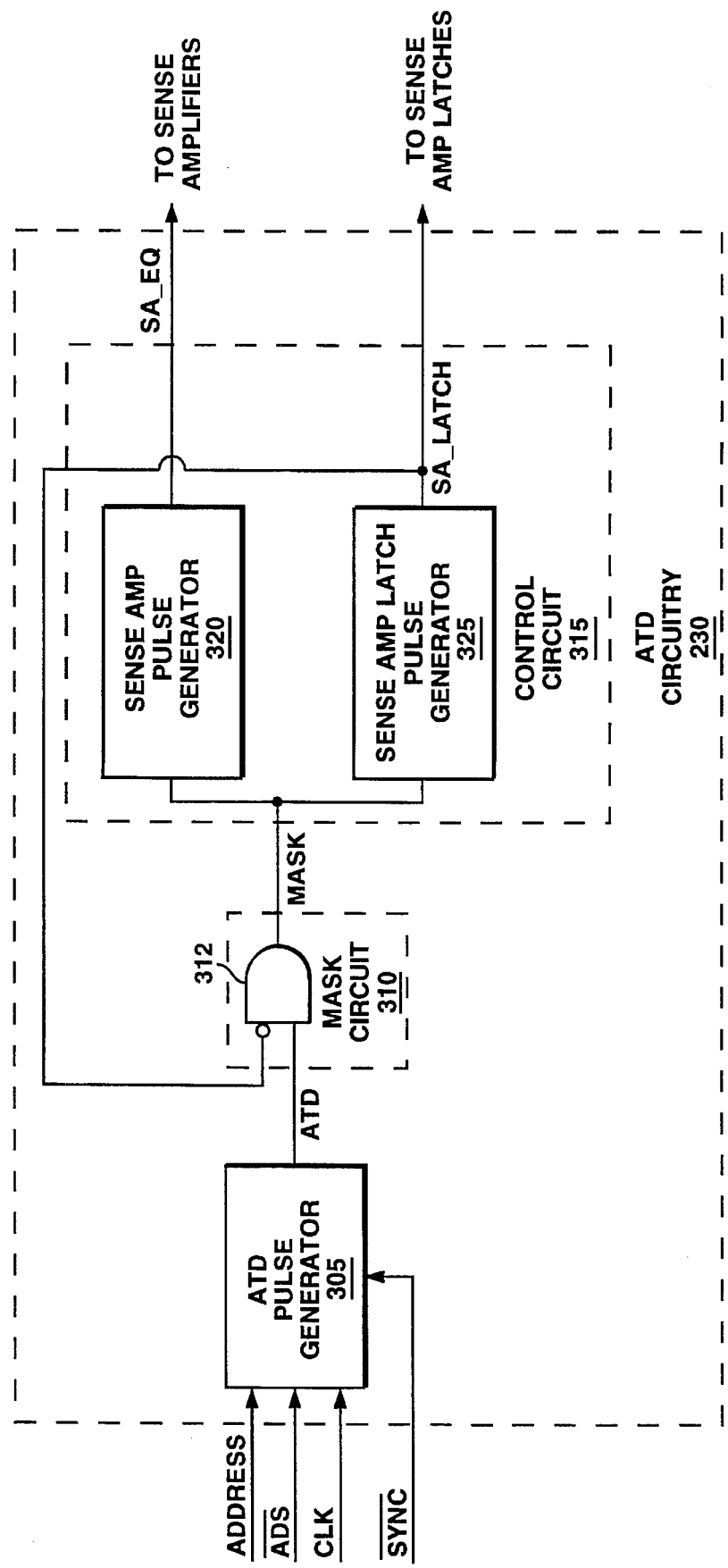
FIG. 3 shows the ATD circuitry of FIG. 2 in more detail.

FIG. 3 shows the ATD circuitry 230 in more detail. ATD circuitry 230 generally comprises an ATD pulse generator 305, a mask circuit 310, and a control circuit 315. The ATD pulse generator 305 generates an ATD pulse at its output in response to the appropriate control signal conditions. For example, if the flash EEPROM 200 is selected to operate asynchronously, the ATD pulse generator 305 generates an ATD pulse in response to a detected transition in the address lines. For synchronous operation of flash EEPROM 200, the ATD pulse generator 305 generates an ATD pulse in response to the ADS signal being active low when the CLK signal rises.

The mask circuit 310 is provided to mask an undesired ATD pulse generated by the ATD pulse generator 305. As shown, the mask circuit 310 may simply include a logical AND gate 312 having a first input coupled to receive the ATD pulse, a second inverted input coupled to an output of the control circuit 315, and an output coupled to an input of the control circuit 315.

The control circuit 315 outputs two control signals, one to the sense amplifiers 215, and one to the sense amp latches 220, in response to an ATD pulse received at its input. As shown, the control circuit 315 generally includes a sense amp pulse generator 320, the output of which is used to equalize the sense amplifiers 215, and a sense amp latch pulse generator 325, which outputs a pulse to cause the sense amp latches 220 to latch the outputs of the sense amplifiers. For this example, the second inverted input of the logical AND gate 312 is coupled to the output of the sense amp latch pulse generator 325.

Figure 4:
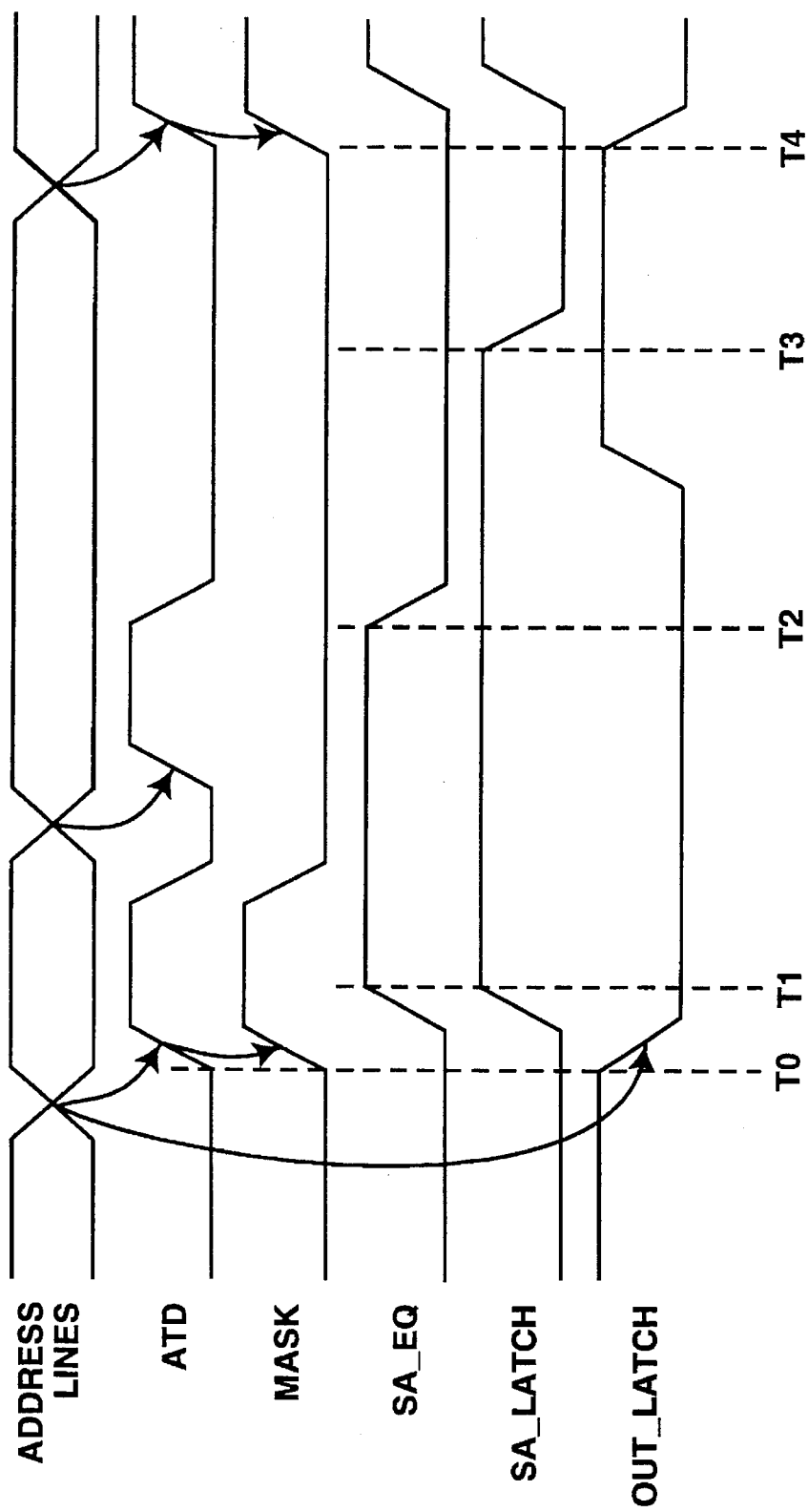
FIG. 4 shows operation of ATD circuitry for an asynchronous memory device.

The asynchronous operation of the ATD circuitry 230 is now discussed with respect to FIG. 4. Assuming that the $\overline{\text{SYNC}}$ signal is inactive high, transitions in the value of the address lines will result in an ATD pulse being generated on the ATD signal line by the ATD pulse generator 305. Thus, prior to time T0, the value of the address lines transitions as shown. At time T0, the ATD pulse generator 305 generates an ATD pulse on the ATD signal line in response to the address transition. Assuming that the output of the sense amp latch pulse generator 325 is at a logic low level, the mask circuit 310 outputs the ATD pulse on the mask signal line that has been generated by the ATD pulse generator 305. While there may be some propagation delay caused by the insertion of the mask circuit 310 between the ATD pulse generator 305 and the control circuit 315, the ATD pulse and the mask pulse are shown as occurring simultaneously for the purposes of simplifying the example. Once the value of the address lines transitions, the output latches 225 close, latching the value output by the sense amp latches 220 in response to output latch signal OUT_LATCH being deasserted at time T0. The output latch signal OUT_LATCH is controlled by circuitry that is not shown.

At time T1, control circuit 315 generates asserts a sense amp equalization signal SA_EQ and a sense amp latch signal SA_LATCH in response to receipt of the ATD pulse from mask circuit 310. Asserting SA_EQ results in the equalization of the sense amplifiers 215, and asserting SA_LATCH causes the sense amp latches 220 to open. The sense amp equalization process occurs from time T1 to time T2, and SA_EQ is deasserted at time T2. Sensing of the data word occurs between times T2 and T3, and the sense amp latch signal SA_LATCH therefore remains high during the period between times T2 and T3. OUT_LATCH is deasserted between times T2 and T3, opening the output latches 225. At time T3, the data word has been sensed, and the sense amp latches 220 close in response to the deassertion of SA_LATCH, latching the data output by sense amplifiers 215.

As shown in FIG. 4, if an address transition should occur while the sense amp latch pulse is asserted high, the resultant ATD pulse generated by the ATD pulse generator 305 will be masked by the mask circuit 310. This is shown by the MASK signal between times T1 and T2, as no pulse is generated by the mask circuit 310 in response to this second ATD pulse.

Figure 5:
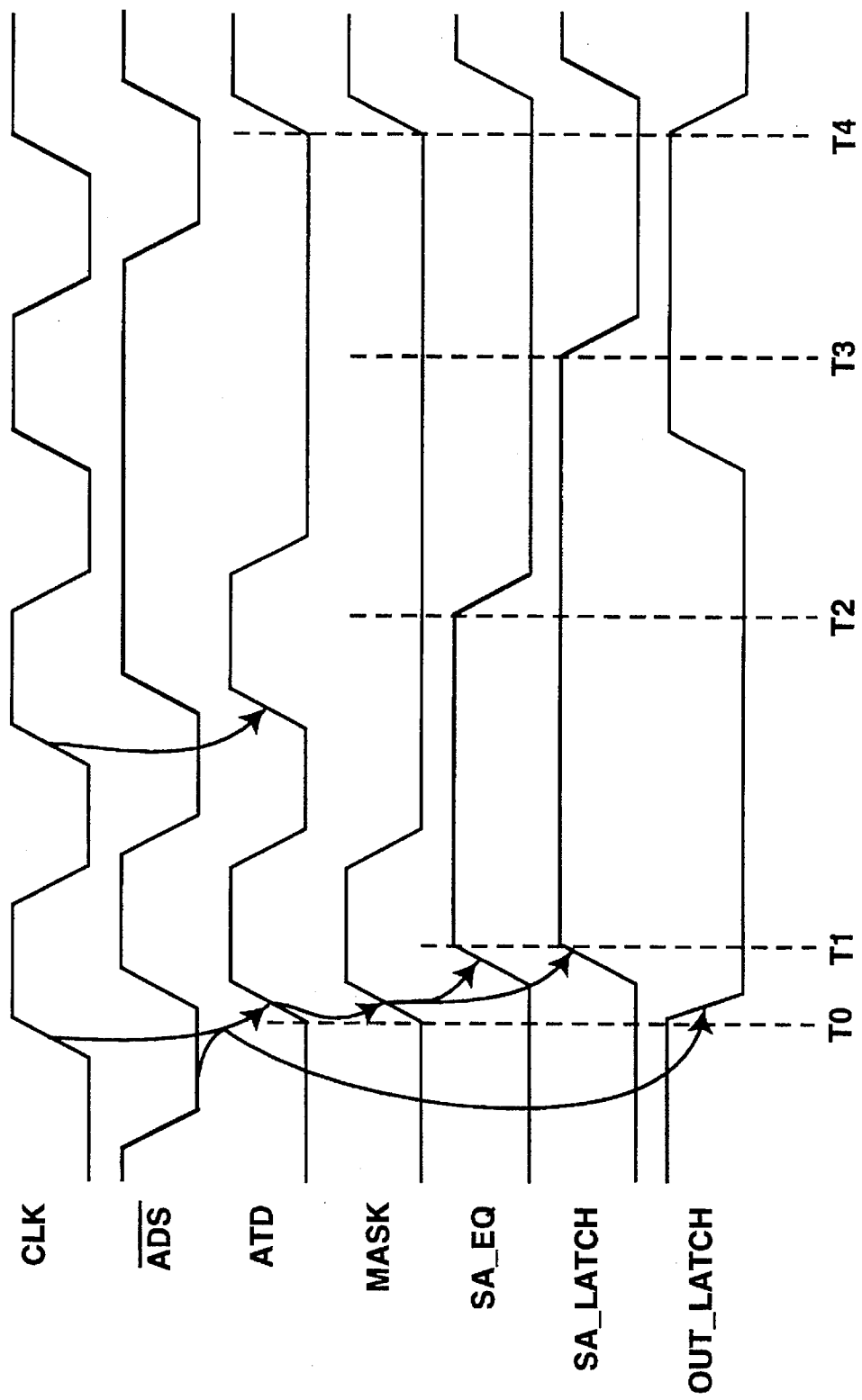
FIG. 5 shows operation of ATD circuitry for a synchronous memory device.

FIG. 5 shows the synchronous operation of ATD circuitry 230 shown in FIG. 3. Prior to time T0, the CLK signal transitions from a low state to a high state while the $\overline{\text{ADS}}$ signal is active low. The ATD pulse generator 305 responds by generating an ATD pulse that is passed to the control circuit 315 by the mask circuit 310. In response to receiving the ATD pulse, the control circuit 315 asserts the sense amp pulse and the sense amp latch pulse. On a subsequent transition of the CLK signal from a low state to a high state, the $\overline{\text{ADS}}$ signal is again asserted, and the ATD pulse generator 305 generates a second ATD pulse. This may occur for example, in the case where the ×16 flash EEPROM 200 is operating in the ×8 mode.

When sequentially reading out the bytes of a data word in the ×8 mode, the two bytes of the data word are sensed in response to receiving the address of the first byte, and the output multiplexer 240 is enabled to output only the first byte of the data word from output latches 225. To provide the second byte of data, the address of the second byte of data, as indicated by toggling address bit A0, must be passed to the memory device so that the multiplexer may be appropriately configured to output the second byte of data from output latches 225. Therefore, the second address of the data word is indicated as a valid address, which activates the ATD circuitry to reset the sense amplifiers even though the desired data is already contained in the sense amplifiers.

The mask circuit 310 prevents the propagation of the second ATD pulse because the SA_LATCH signal remains in a logic high state. From time T1 to time T2 the sense amplifiers 215 are equalized in response to the SA_EQ signal being in a logic high state. At time T2, the sense amplifiers 215 begin to sense the data of the selected memory cells in response to the sense amp pulse going low. The SA_LATCH signal remains high from time T2 to time T3 such that the sense amp latches 220 remain open. At time T3, the SA_LATCH signal is deasserted to close the sense amp latches 220, latching the output of sense amplifiers 215. The data sensed by the sense amplifiers 215 between times T2 and T3 are output until the next synchronous read access is signaled by the $\overline{\text{ADS}}$ signal being active when the CLK signal transitions from the low state to the high state at time T4.

Thus, a second ATD pulse is prevented from propagating to control circuit 315 while address bit A0 is allowed propagate to multiplexer 240. Multiplexer 240 may therefore sequentially select the correct byte of data to be output from output latches 225, and the sense amplifiers need be reset only when initially sensing the entire word of data.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. In a memory device, a circuit comprising:

a pulse generator operative to generate a pulse;

a control circuit having an input and an output, the control circuit being operative to cause a first control signal to go active in response to receiving the pulse; and a mask circuit coupled in series between the pulse generator and the control circuit and coupled to receive the first control signal, the mask circuit being operative to prevent propagation of the pulse to the control circuit when the first control signal is active.

2. The circuit of claim 1, wherein the circuit further comprises:

an array of memory cells arranged in rows in columns;

a plurality of sense amplifiers coupled to the columns of the array of memory cells; and a plurality of latches coupled to the sense amplifiers and coupled to receive the first control signal, the latches being operative to pass data sensed by the sense amplifiers when the first control signal is active.

3. The circuit of claim 2, wherein the control circuit causes a second control signal to go active in response to receiving the pulse, the sense amplifiers being coupled to receive the second control signal, the sense amplifiers being reset in response to the second control signal being active.

4. The circuit of claim 1, wherein the pulse generator is coupled to a plurality of address conductors for conveying an address, the pulse generator for generating the pulse in response to the address changing.

5. The circuit of claim 1, wherein the pulse generator is coupled to receive a clock signal and a second control signal, the pulse generator for generating the pulse in response to the second control signal being active when the clock signal transitions from a first logic state to a second logic state.

6. A memory device comprising:

a plurality of address conductors for receiving an address;

an array of memory cells arranged in rows in columns;

a decoder circuit coupled to the address conductors and the array of memory cells, the decoder circuit for selecting memory cells to output data in response to the address;

a plurality of sense amplifiers coupled to the columns of the array of memory cells for sensing data of memory cells selected by the decoder circuit, the sense amplifiers being reset when a first control signal goes active;

a plurality of latches coupled to the sense amplifiers, the latches passing data output by the sense amplifiers when a second control signal is active;

a pulse generator for generating a pulse;

a control circuit for causing the first and second control signals to go active in response to receiving the pulse; and a mask circuit coupled in series between the pulse generator and the control circuit and coupled to receive the second control signal, the mask circuit being operative to prevent propagation of the pulse to the control circuit when the second control signal is active.

7. The memory device of claim 6, wherein the pulse generator is coupled to the plurality of address conductors, the pulse generator for generating the pulse in response to the address being changed.

8. The memory device of claim 6, wherein the pulse generator is coupled to a clock signal and a third control signal, the pulse generator for generating the pulse in response to the third control signal going active when the clock signal transitions from a first logic state to a second logic state.

9. The memory device of claim 6, wherein the mask circuit comprises a logical AND gate having a first inverted input coupled to the second control signal, a second input coupled to the pulse generator, and an output coupled to an input of the control circuit.

10. In a memory device, a method for preventing propagation of a pulse comprising the steps of:

generating a first pulse by a pulse generator;

passing the first pulse by a mask circuit;

asserting a first control signal by a control circuit;

generating a second pulse by the pulse generator;

preventing propagation of the second pulse to the control circuit by the mask circuit if the first control signal is asserted when the second pulse is received by the mask circuit; and passing the second pulse to the control circuit by the mask circuit if the first control signal is deasserted when the second pulse is received by the mask circuit.

11. The method of claim 10, further comprising the steps of:

transitioning by address lines of the memory device from a first state to a second state, the pulse generator generating the first pulse in response to detecting the address lines transitioning from the first to the second state; and transitioning by address lines of the memory device from the second state to a third state, the pulse generator generating the second pulse in response to detecting the address lines transitioning from the second to the third state.

12. The method of claim 10, further comprising the step of:

detecting by the pulse generator a second control signal as being in a first state when a clock signal transitions from a first logic state to a second logic state, the pulse generator generating the first pulse in response to the detecting step at a first time and generating the second pulse in response to the detecting step at a second time.

* * * * *